United States Patent
Kabouzi et al.

(10) Patent No.: US 10,242,849 B2
(45) Date of Patent: *Mar. 26, 2019

(54) SYSTEM AND METHOD FOR DETECTING A PROCESS POINT IN MULTI-MODE PULSE PROCESSES

(71) Applicant: Lam Research Corporation, Fremont, CA (US)

(72) Inventors: Yassine Kabouzi, Fremont, CA (US); Jorge Luque, Redwood City, CA (US); Andrew D. Bailey, III, San Jose, CA (US); Mehmet Derya Tetiker, San Francisco, CA (US); Ramkumar Subramanian, Fremont, CA (US); Yoko Yamaguchi, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/479,597

(22) Filed: Apr. 5, 2017

(65) Prior Publication Data
US 2017/0207070 A1 Jul. 20, 2017

Related U.S. Application Data

(62) Division of application No. 14/523,770, filed on Oct. 24, 2014, now Pat. No. 9,640,371.
(Continued)

(51) Int. Cl.
*H01L 21/3065* (2006.01)
*H01J 37/32* (2006.01)
(Continued)

(52) U.S. Cl.
CPC .. *H01J 37/32963* (2013.01); *H01J 37/32082* (2013.01); *H01J 37/32137* (2013.01);
(Continued)

(58) Field of Classification Search
CPC ........... H01J 2237/334; H01J 37/32082; H01J 37/32137; H01J 37/32183;
(Continued)

(56) References Cited

U.S. PATENT DOCUMENTS 9,640,371 B2 * 5/2017 Kabouzi ........... H01J 37/32963
2004/0203177 A1 * 10/2004 Davis ................. G03F 7/70625
438/14
(Continued)

*Primary Examiner* — Lan Vinh
(74) *Attorney, Agent, or Firm* — Penilla IP, APC

(57) ABSTRACT

A system and method of identifying a selected process point in a multi-mode pulsing process includes applying a multi-mode pulsing process to a selected wafer in a plasma process chamber, the multi-mode pulsing process including multiple cycles, each one of the cycles including at least one of multiple, different phases. At least one process output variable is collected for a selected at least one of the phases, during multiple cycles for the selected wafer. An envelope and/or a template of the collected at least one process output variable can be used to identify the selected process point. A first trajectory for the collected process output variable of a previous phase can be compared to a second trajectory of the process output variable of the selected phase. A multivariate analysis statistic of the second trajectory can be calculated and used to identify the selected process point.

18 Claims, 14 Drawing Sheets

Related U.S. Application Data

(60) Provisional application No. 62/066,330, filed on Oct. 20, 2014.

(51) Int. Cl.
*H01L 21/67* (2006.01)
*H01L 21/66* (2006.01)

(52) U.S. Cl.
CPC .. *H01J 37/32183* (2013.01); *H01J 37/32532* (2013.01); *H01L 21/3065* (2013.01); *H01L 21/67069* (2013.01); *H01L 21/67253* (2013.01); *H01L 22/26* (2013.01); *H01J 2237/334* (2013.01)

(58) Field of Classification Search
CPC .......... H01J 37/32532; H01J 37/32963; H01L 21/3065; H01L 21/67069; H01L 21/67253; H01L 22/26
USPC ....... 438/706, 710, 712, 714, 719, 720, 723, 438/736, 778; 216/58, 60, 67; 156/345.24, 345.25
See application file for complete search history.

(56) References Cited

U.S. PATENT DOCUMENTS

| | | | |
|---|---|---|---|
| 2004/0238489 A1* | 12/2004 | Johnson | B81C 1/00587 216/60 |
| 2005/0006341 A1* | 1/2005 | Frum | H01J 37/32935 216/59 |

* cited by examiner

SYSTEM AND METHOD FOR DETECTING A PROCESS POINT IN MULTI-MODE PULSE PROCESSES

This application is a divisional of and claims the benefit, under 25 U.S.C. § 120, of U.S. patent application Ser. No. 14/523,770, filed on Oct. 24, 2014 and entitled "System and Method for Detecting a Process Point in Multi-Mode Pulse Processes," which is incorporated herein by reference in its entirety for all purposes.

The U.S. patent application Ser. No. 14/523,770 claims priority, under 35 U.S.C. § 119(e), from U.S. Provisional Patent Application No. 62/066,330 filed on Oct. 20, 2014 and entitled "System and Method for Detecting a Process Point in Multi-Mode Pulse Processes," which is incorporated herein by reference in its entirety for all purposes.

The present invention relates generally to multi-mode pulse processes, and more particularly, to systems and methods for accurately detecting endpoint in multi-mode pulse processes.

Typical etch processes utilize optical emission spectrum analysis to determine when an endpoint of the etch process has been attained. A typical plasma etch process includes a process time on the order of several second to tens of minutes. The etch chemistry, pressure, temperature, biasing voltage, RF frequency, RF voltage, RF current, and RF power are substantially constant throughout the etch process. The plasma includes process chemistries (e.g., process gases) and etch byproducts. The etch byproducts emit a corresponding signature optical spectrum.

Many newer plasma processes are multi-mode pulsed plasma processes and can include multiple different processes. Each of the processes is utilized for a portion of each cycle and is referred to as a phase. By way of example, a multi-mode process can include a deposition phase, a breakthrough phase and an etch phase. Unfortunately, each of the chemistry, pressure, temperature, biasing voltage, RF frequency, RF voltage, RF current, and RF power can be varied in each phase in the multi-mode pulse process. As a result, the variable multi-mode pulse process conditions prevent typical endpoint detection systems from accurately identifying an endpoint of the multi-mode pulse process as the optical spectrum varies within the variable multi-mode pulse process conditions. Further, over-etching into a stop layer can result in excess etch depth in the layer to be etched which can damage or deform the features being formed by the etch process.

In view of the foregoing, there is a need for accurately detecting the endpoint of a multi-mode pulse process.

SUMMARY

Broadly speaking, the present invention fills these needs by providing systems and methods for accurately detecting the endpoint of a multi-mode pulse process. It should be appreciated that the present invention can be implemented in numerous ways, including as a process, an apparatus, a system, computer readable media, or a device. Several inventive embodiments of the present invention are described below.

One embodiment provides a system and method of identifying a selected process point in a multi-mode pulsing process includes applying a multi-mode pulsing process to a selected wafer in a plasma process chamber, the multi-mode pulsing process including multiple cycles, each one of the cycles including at least one of multiple, different phases. At least one process output variable is collected for a selected at least one of the phases, during multiple cycles for the selected wafer.

The method can also include analyzing the collected at least one process output variable and identifying a selected process point from the analyzed at least one process output variable. Identifying the selected process point from the analyzed at least one output variable can include identifying an endpoint of the multi-mode pulsing process. Collecting the at least one process output variable for the selected at least one of the phases, during multiple of cycles for the selected wafer can include collecting the at least one process output variable at a sampling rate of between about 1 Hz and about 10,000 Hz.

Analyzing the collected at least one process output variable can include determining an envelope of the collected at least one process output variable. Identifying the selected process point from the analyzed at least one process output variable can include identifying a multi-mode pulsing process point from the envelope of the collected at least one process output variable. Identifying the selected pulsing process point from the analyzed at least one process output variable can include identifying the selected pulsing process point corresponding to a selected trend in a slope of the envelope.

Analyzing the collected at least one process output variable can also or alternatively include identifying a template for the selected process point of the multi-mode pulsing process. Identifying the selected pulsing process point from the analyzed at least one process output variable can include matching the template for the selected process point to the collected at least one process output variable. Identifying the template for the selected process point of the multi-mode pulsing process can include a curve of a monitored at least one process output variable during the multi-mode pulsing process for multiple wafers, including or not including the selected wafer.

The collected at least one process output variable can be selected from an optical emission spectrum emitted from a plasma during the multi-mode pulsing process. The collected at least one process output variable can be selected from a reflected spectrum reflected from a top surface of the wafer during the multi-mode pulsing process.

The collected at least one process output variable can be varied in each of the different phases. Each of the different phases can have a duration of between about 2 second and about 20 seconds.

A first trajectory for at least one of the collected process output variable of a previous phase or phases can be compared to a second trajectory of a corresponding collected process output variable of the selected phase or phases. A multivariate analysis statistic can be calculated for one or more subsequent trajectories and the selected process point can be identified when the multivariate analysis statistic for the subsequent trajectories exceeds a threshold value.

The at least one process output variable can include multiple wavelengths of light. A multi-mode pulsing process can change for each of the different phases. The monitored output process variable can include at least one of an emitted spectrum, a reflected spectrum, an RF harmonic, an RF voltage, an RF current, an RF impedance, a process chamber temperature and/or a process chamber pressure.

Another embodiment provides a multi-mode pulsing plasma processing system including a plasma processing chamber configured for performing plasma processes on a wafer, the plasma processing chamber including multiple sensors, each of the sensors configured to detect at least one corresponding output process variable. At least one bias source, at least one RF source and at least one gas source are coupled to the plasma processing chamber. A controller is coupled to each of the plasma processing chamber, the plurality of sensors, the at least one bias source, the at least one RF source and the at least one gas source. The controller including at least one multi-mode pulsing plasma processing recipe and at least one multi-mode pulsing plasma processing point detection logic embodied on computer readable medium including computer executable logic for applying the multi-mode pulsing process to a selected wafer in the plasma process chamber, the multi-mode pulsing process including multiple cycles, each one of the cycles including one or more different phases. The at least one multi-mode pulsing plasma processing point detection logic includes computer executable logic for collecting the at least one process output variable for a selected at least one of the phases, during the cycles for the selected wafer. The at least one multi-mode pulsing plasma processing point detection logic includes computer executable logic for analyzing the collected at least one process output variable. Further, the at least one multi-mode pulsing plasma processing point detection logic includes computer executable logic for identifying the selected process point from the analyzed at least one process output variable.

The disclosed embodiments provide an advantage of more accurately, quickly differentiating an endpoint of a multi-mode process from a change in phase of the multi-mode pulsing plasma process. The disclosed embodiments also provide the advantage of differentiating other process point during the multi-mode pulsing plasma process, other than an endpoint, from a change in phase of the multi-mode pulsing plasma process. Accurately, quickly identifying process points and/or endpoints provides more precise multi-mode pulsing plasma process control, reduces overall process time and increases production throughput of the multi-mode pulsing plasma process.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION

Figure 1A:
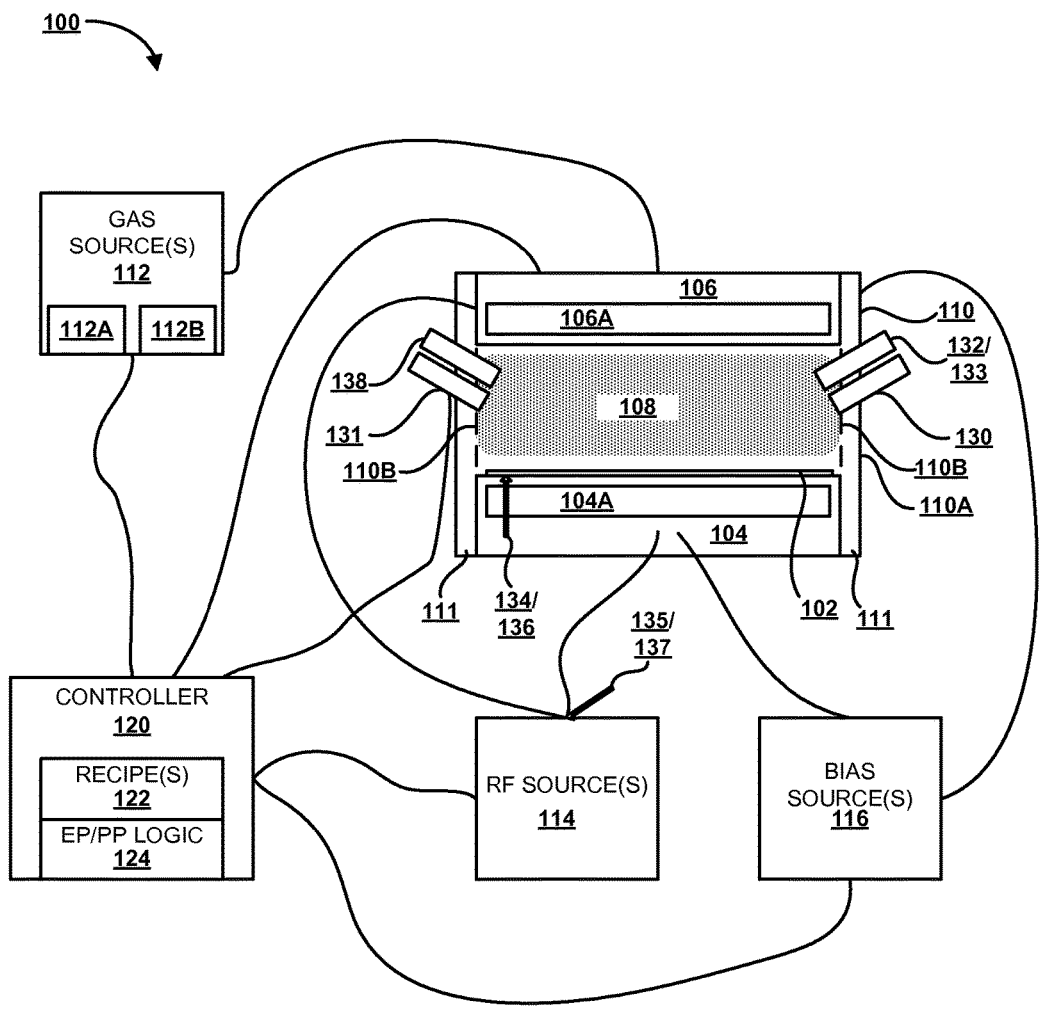
FIG. 1A is a schematic diagram of a multi-mode pulse process system 100, for implementing embodiments of the present disclosure.

Several exemplary embodiments for systems and methods for accurately detecting a selected process point such as an endpoint or other point during a multi-mode pulse process will now be described. It will be apparent to those skilled in the art that the present invention may be practiced without some or all of the specific details set forth herein.

In an etch process, the surface being etched includes several layers such as one or more mask layers as a top most layer, followed by one or more layers to be etched underlying the mask layer. A stop layer is typically included below the layer(s) to be etched. The stop layer typically has a slower etch rate than the layer to be etched.

When the etch process experiences a breakthrough into the stop layer, the optical spectrum of the plasma will include the signature optical spectrum of the stop layer. This breakthrough point can then be used to identify an endpoint. The optical spectrum of the plasma can thus be monitored to identify the endpoint of the etch process when the etch process etches past the layer being etched and over etches some depth into the stop layer.

Multi-mode pulse processes include multiple processes. Each of the multiple processes is utilized for a relatively short duration, referred to as a phase. By way of example, a multi-mode process can include a deposition phase, a breakthrough phase and an etch phase. Each of the phases could be as short as about 10 seconds or longer. The phases are executed in rapid succession in each single multi-mode pulse process cycle. Multiple cycles are applied to the layer to be etched to achieve the desired etch result.

As described above, the typical optical emission spectrum approach does not work well in a multi-mode pulse process system. There are many variables that can be monitored to identify an endpoint of a multi-mode pulse process. By way of example, one or more wavelength of light can be monitored. The one or more wavelength of light can be emitted by the plasma as an optical emission. Additionally or alternatively, the one or more wavelength of light can be a reflected light emitted from a light source and reflected off the surface being etched. The monitored one or more wavelength of light can be between about 190 nm and about 1000 nm.

Further, identifying process points other than the process endpoint in the multi-mode pulse process can also be helpful. A selected process point can occur mid-process, after the beginning of the multi-mode pulse process and before the endpoint. By way of example, identifying a selected process point in the multi-mode pulse process that occurs within a known number of phases of the multi-mode pulse process before the endpoint could be used as an indicator to change the multi-mode pulse process such as increased or reduced time phases, increased or reduced amplitude RF signals, or other process variables that can change the process rate so that the process rate (e.g., etch rate) tapers off or ends abruptly, as may be desired.

Other multi-mode pulse process variables in addition to or instead of emitted and reflected light can be monitored to identify an endpoint or a process point. Example multi-mode pulse process variables that can be monitored include the RF voltage, RF current, RF impedance, one or more RF harmonic and a multi-mode pulse process chamber pressure and/or a temperature.

As the multi-mode pulse process changes in each phase, the chemical content of the plasma varies. The conductivity of the plasma also varies corresponding to the variations in the chemical content of the plasma. The variable conductivity of the plasma can cause RF harmonics to occur as the impedance of the plasma changes from a matched impedance. The RF harmonics can be detected and the waveform and/or phase of the harmonics can be monitored during the multi-mode pulse process. The variable conductivity of the plasma can cause corresponding variations in RF voltage and/or current. The variations in RF voltage and/or current can be monitored during the multi-mode pulse process.

One approach to detecting an endpoint or a selected process point in a multi-mode pulse process can include monitoring one or more process output variables. By way of example the one or more process output variables can be an emitted spectrum, a reflected spectrum, an RF harmonic, an RF voltage, an RF current, an RF impedance, a process chamber temperature and/or a process chamber pressure of the multi-mode pulse process chamber during the multi-mode pulse process. The data for each of the monitored process output variables can be processed to identify an envelope corresponding to the monitored process output variable. Additionally or alternatively, the data for each of the monitored process output variables can be processed to identify a template corresponding to the monitored process stage or event. Additionally or alternatively, proximity to the identified envelope can be monitored to detect the desired process point. Additionally or alternatively, the data for each of the monitored process output variables can be processed to identify a mean value or trend in the phases of the cycles prior to the monitored process point. Such methods can also be applied to linear or non-linear combinations of more than one of the monitored process output variables.

At least one reference envelope or template from one or more monitored process variables corresponding to the monitored process point can be extracted from process data. This reference data can be used to model the monitored process point to identify an endpoint and/or other process point for the multi-mode pulse process.

The endpoint or the process point for the multi-mode pulse process can be identified in real time or very near real time. By way of example, in some implementations, the endpoint or the process point can be identified in less than a single phase of the multi-mode pulse process using one or more of the disclosed detection processes.

FIG. 1A is a schematic diagram of a multi-mode pulse process system 100, for implementing embodiments of the present disclosure. The multi-mode pulse process system 100 includes a plasma process chamber 110, one or more gas sources 112, one or more RF sources 114, one or more Bias sources 116 and a controller 120.

The plasma process chamber 110 includes a wafer support 104 for supporting a wafer 102 to be processed in the plasma process chamber 110. The wafer support 104 forms a first electrode and can be coupled to one or both of the one or more RF sources 114 and one or more bias sources 116. The plasma process chamber 110 also includes a second electrode 106, opposite from the wafer support 104. The second electrode 106 can be coupled to one or both of the one or more RF sources 114 and one or more bias sources 116.

Each of the wafer support 104 and the second electrode 106 include respective temperature control devices 104A, 106A for controlling the temperature of the respective wafer/wafer support and second electrode. The temperature control devices 104A, 106A can include heaters for increasing the temperature of the respective wafer/wafer support and second electrode. Alternatively or additionally, the temperature control devices 104A, 106A can include cooling devices for decreasing the temperature of the respective wafer/wafer support and second electrode.

The second electrode 106 can be coupled to the one or more gas sources 112 and the controller 120. The second electrode 106 can include a gas injection system for injecting the one or more gases supplied from the gas sources 112 into the plasma process chamber 110. The gas injection system can include a directed gas injection such as a nozzle and/or a gas dispersion system such as a showerhead for dispersing the injected gases into the plasma process chamber.

The plasma process chamber 110 also includes one or more sensors 130, 131. The one or more sensors 130, 131 can detect broad spectrums of light e.g., between about 190 nm and about 1000 nm. One or both of the sensors 130, 131 can include one or more light emitters for emitting a light toward the surface of the wafer 102. The one or more sensors 130, 131 can detect a spectrum of light reflected from the surface of the wafer 102 and/or light emitted from the plasma 108. The one or more sensors 130, 131 can include a photo-diode or other type of light sensors.

The plasma process chamber 110 can also include a pressure sensor 132, a temperature sensor 133, RF voltage sensors 134, 135, RF current sensors 136, 137 and RF probe 138. Each of the sensors 130-138 are coupled to the controller 120 to provide respective sensor inputs to the controller.

The plasma process chamber 110 also includes one or more outlets 111 for removing the gases and process byproducts from the plasma process chamber. The one or more outlets 111 can be coupled to suitable low pressure sources (e.g., pumps) and/or heated or cooled surfaces as may be desired.

The gas sources 112 can include one or more process gases sources and one or more purge and/or carrier gas sources. The gas sources 112 can also include flow meters 112A and flow controllers 112B for monitoring and controlling the flow of the gas sources into the plasma process chamber 110 as may be determined by the controller 120.

The RF sources 114 can include multiple, different RF sources, each of the RF sources outputting RF signals having different amplitude, power level, frequency and/or modulation and/or duty cycle. Respective RF sources 114 can be coupled to one or both of the wafer support 104 or the second electrode 106. By way of example, the RF sources can include an about 2 MHz RF source, an about 25-30 MHz RF source and about a 50-75 MHz RF source.

The bias sources 116 can include one or more DC bias and ground potential sources. Respective bias sources 116 can be coupled to one or both of the wafer support 104 or the second electrode 106 or other portions of the plasma process chamber 110. Other portions of the plasma process chamber 110 can include sidewalls 110A, various shields and plasma containment structures 110B.

The controller 120 is coupled to each of the plasma process chamber 110, the gas sources 112, the RF sources 114 and the bias sources 116 for controlling and monitoring the operations of each of the plasma process chamber, the gas sources, the RF sources and the bias sources. The controller 120 also includes one or more recipes 122 embodied on computer readable media that the controller can use to control the process variables such as bias voltages, multi-mode pulse process phase length, multi-mode pulse process phase order, mixture of multi-mode pulse process phases in each cycle, number of multi-mode pulse process cycles, RF frequencies, RF powers, RF modulations, duty cycles, process chemistries, gas mixtures, gas flow rates, pressures, temperatures of at least one portion of the plasma process chamber 110 during the multi-mode pulse process operations of the plasma process chamber. By way of example, the one or more recipes 122 can include a multi-mode pulsing process recipe for applying multi-mode pulsing process to the wafer 102.

The controller 120 also includes endpoint and process point logic 124 embodied on computer readable media so that the controller can accurately determine a process point during the process and/or a process endpoint. By way of example, the endpoint and process point logic 124 can allow the controller to detect an endpoint and/or a selected process point for a multi-mode pulsing process being applied to the wafer 102.

Figure 1B:
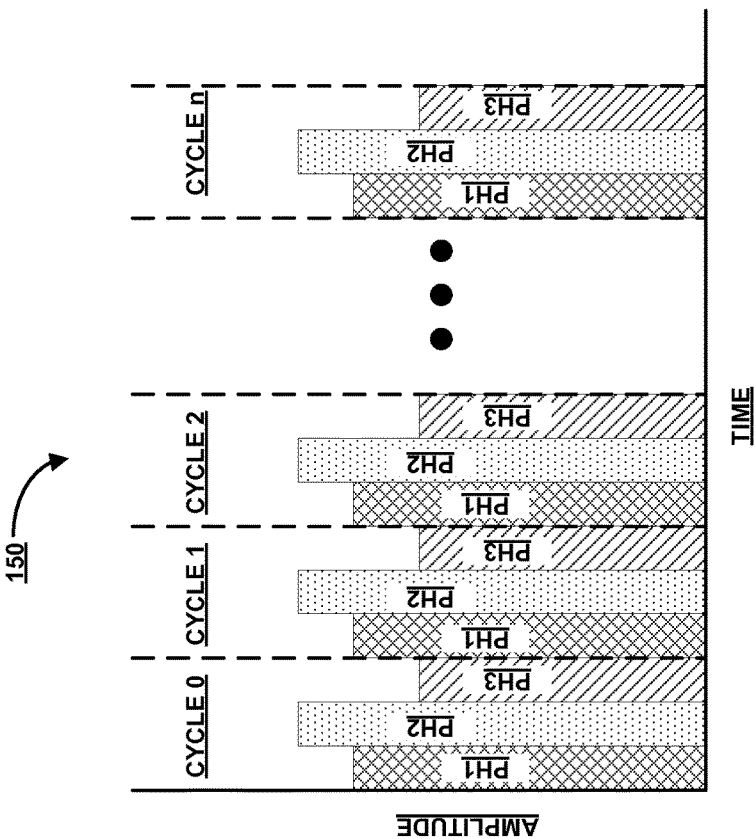
FIG. 1B is a graphical representation of a multi-mode pulse process, for implementing embodiments of the present disclosure.

FIG. 1B is a graphical representation of a multi-mode pulse process 150, for implementing embodiments of the present disclosure. The multi-mode pulse process 150 includes multiple cycles: cycle 0 through cycle n. Each of the cycles 0-n include one or more phases: phase 1, phase 2, phase 3. The process(es) occurring in the processing chamber 110 is different during each of the phases 1-3. By way of example, phase 1 can be a deposition process while phase 2 can be an etch process and phase 3 can be a passivation process. As a result, during each of the cycles 0-n, a layer is deposited or formed on the surface of wafer 102 during the phase 1, the deposited layer is etched through in the breakthrough phase 2 and the underlying layer is etched in the etch phase 3. Other types of phases can also be used in addition to or instead of one or more of the deposition process, the etch process and the passivation process. Further, it should be understood that different types of each one of the deposition processes, etch processes and passivation processes can be used.

It should be understood that while three phases (phases 1-3) are shown, more or less than three phases can be used in each of the cycles 0-n. It should also be understood that while the phases 1-3 are shown having substantially equal durations in time, each of the phases can have a different duration. It should also be understood that each of the phases can be at least one or more of an etch process phase where material is etched from the surface being processed, a deposition process phase where material is being formed on the surface to be processed, a passivation process phase and similar types processes and combinations of each of these types of processes.

Figure 2D:
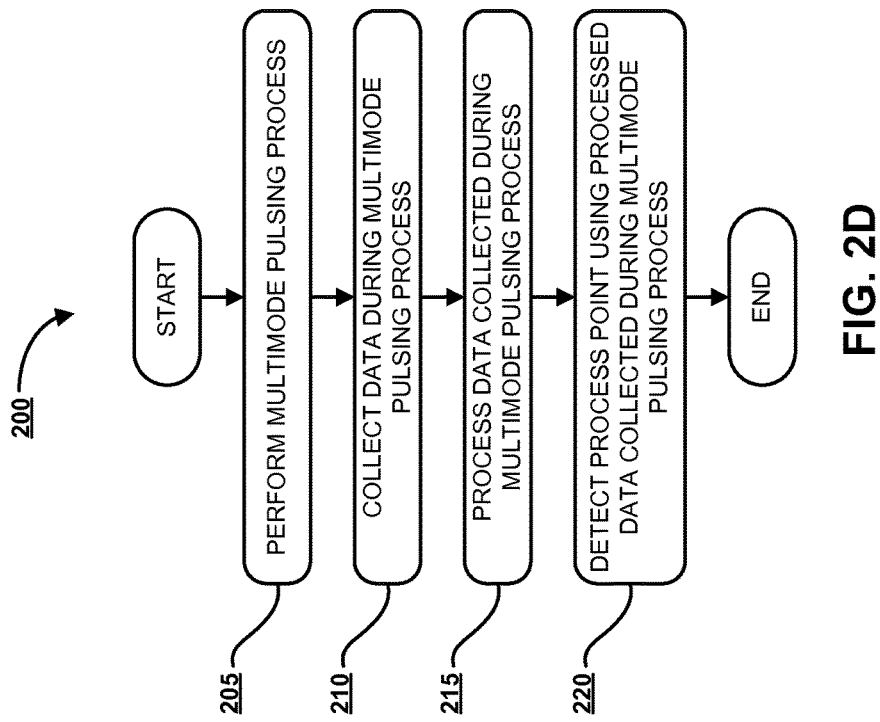
FIG. 2D is a flowchart diagram that illustrates an overview of method operations performed during the multi-mode pulsing process, for implementing embodiments of the present disclosure.
Figure 2A:
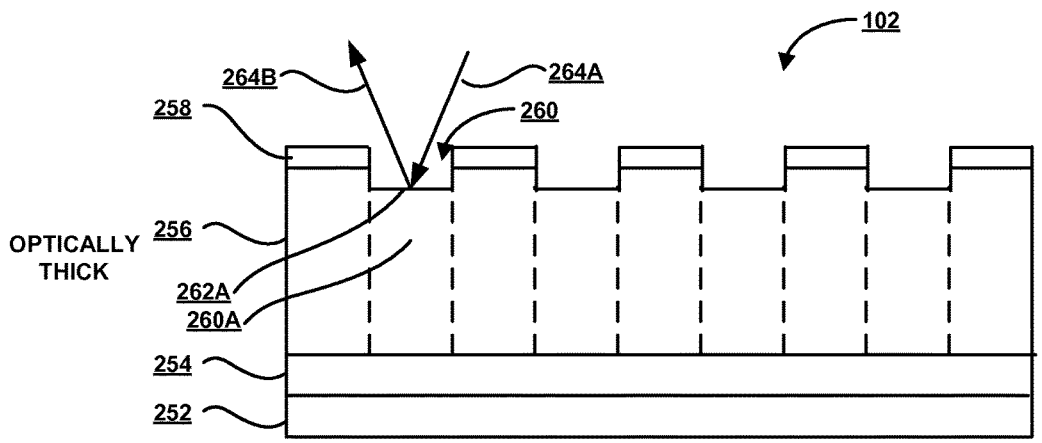
FIGS. 2A-C illustrate a reflected light interacting with a surface of the wafer during the multi-mode pulsing process, for implementing embodiments of the present disclosure.
Figure 2B:
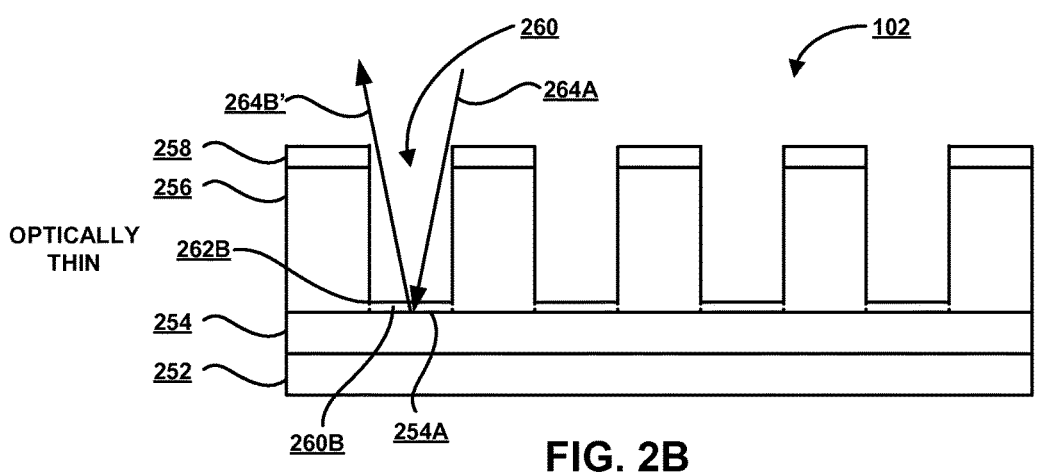
Figure 2C:
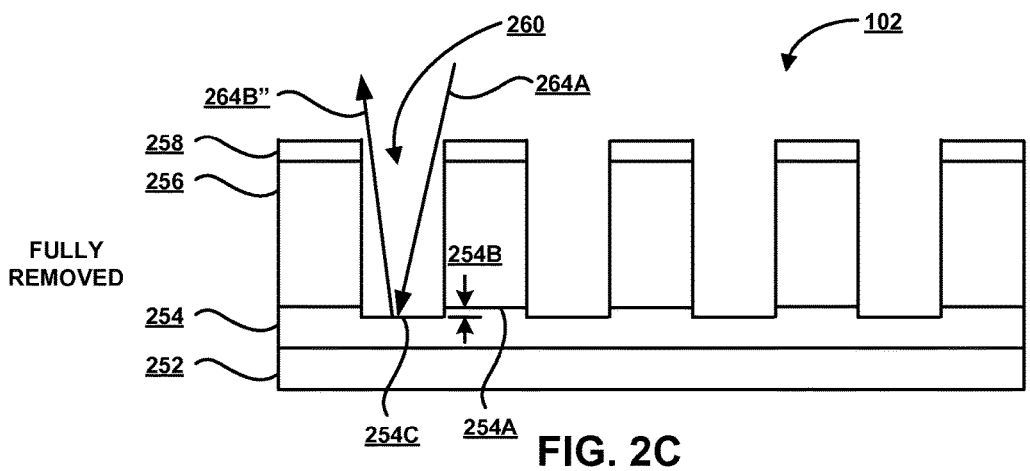

FIGS. 2A-C illustrate a reflected light interacting with a surface of the wafer 102 during the multi-mode pulsing process, for implementing embodiments of the present disclosure. FIGS. 2A-C included a simplified drawing of a cross-section of a portion of the surface of the wafer, not drawn to scale. The wafer 102 includes a base silicon substrate layer 252. One or more layers 254 are formed on the base silicon substrate layer 252. A layer to be etched 256 is formed over the one or more layers 254. A mask layer 258 is formed over the layer to be etched 256. The mask layer 258 covers portions of the layer to be etched 256, as shown. Features 260 are to be formed in the layer to be etched 256 by the multi-mode pulsing process.

As shown in FIG. 2A, the multi-mode pulsing process has begun to etch into the layer to be etched 256 and begin forming the features 260. A light 264A is emitted from a light source (not shown) and directed toward the surface 262A of the material 260A filling the feature 260. The light 264A is reflected off the surface 262A as reflected light 264B because the material 260A is sufficiently optically thick to reflect the light 264B. The intensity of one or more wavelengths in the reflected light 264B can be analyzed to identify the material 260A.

As shown in FIG. 2B, the multi-mode pulsing process has etched further into the layer to be etched 256 and the features 260 are substantially formed. However, an optically thin layer of material 260B still remains in the bottom portion of the features. The thin layer of material 260B is referred to as optically thin because the light 264A penetrates the surface 262B to be reflected off a surface 254A of the underlying layer 254 as reflected light 264B'. As the reflected light 264B' is reflected off the surface 254A of the underlying layer 254, the intensity of the selected wavelength of light will correspond to the material of the underlying layer 254 and may not correspond to the optically thin layer of material 260B remaining in the feature 260. The optically thin layer of material 260B can be as thin as a few atomic layers in thickness or thicker. By way of example, if the layer to be etched 256 is a tungsten containing layer, the tungsten becomes optically thin at a thickness of less than about 10 nm.

If an endpoint or other process point of the etch process were determined only by the intensity of the selected wavelength identifying the underlying layer 254, then the optically thin layer of material 260B would not be fully removed and thus the feature 260 would not be formed fully through the layer to be etched 256 and through to the underlying layer 254.

As shown in FIG. 2C, the multi-mode pulsing process is continued to further etch for a selected period of time or a selected number of cycles or a selected number of phases until the feature penetrates to a depth 254B into the underlying layer 254 as the light 264B" is reflected from the exposed surface 254C of the underlying layer 254.

It should be understood that while light reflected 264B from the surface being processed are discussed other output process variables, as listed above, can be used in addition to or as alternatives of the light reflected from the surface being processed.

FIG. 2D is a flowchart diagram that illustrates an overview of method operations 200 performed during the multi-mode pulsing process, for implementing embodiments of the present disclosure. In an operation 205, a wafer 102 to be processed is placed in the processing chamber 110 and a multi-mode pulsing process is applied to the wafer as determined by one or more of the recipes 122 in the controller 120.

During the multi-mode pulsing process multiple sensors 130-138 are monitored to collect the respective data through multiple phases of each cycle of the multi-mode pulsing process, in an operation 210. By way of example, the one or more sensors 130, 131 can detect a spectrum of light reflected from the surface of the wafer 102 or light emitted from the plasma 108. The pressure sensor 132 can detect pressures in the plasma process chamber 110. The temperature sensor 133 can detect temperatures in selected portions or surfaces of the plasma process chamber 110 or the upper or lower electrodes 106, 104, or the plasma 108 or the wafer 102. The RF voltage sensors 134, 135, RF current sensors 136, 137 and RF probe 138 can detect the RF voltage, RF impedance, RF current and RF voltage and current harmonics.

The respective data from each of the sensors 130-138 can be collected multiple times during each phase of the multi-mode pulsing process. By way of example each sensor 130-138 output to the controller 120 can be sampled and collected as often as between about once per second and as often as about 10 times per millisecond or faster (e.g. between about 1 Hz and greater than about 10,000 Hz sampling and collection rate). In one implementation, each sensor 130-138 output to the controller 120 is sampled and collected as about once every 20 millisecond (e.g., about 50 Hz sampling and collection rate). Slower sampling and collection rates of between 1 Hz and about 10 Hz can also be used. Faster sampling and collection rates of greater than about 10,000 Hz can also be used.

In an operation 215, the collected data is processed to extract information regarding each of the monitored output process variables. By way of example, intensities of one or more selected wavelengths of a reflected light 264B reflected from the surface of the wafer 102 may be analyzed to identify a trend such as an intensity variation in the selected wavelengths of reflected light over a period of time. In an operation 220, the processed data can be analyzed to identify one or more process points, such as an endpoint or a selected process point during the process, as will be described in more detail in the foregoing examples.

Figure 3:
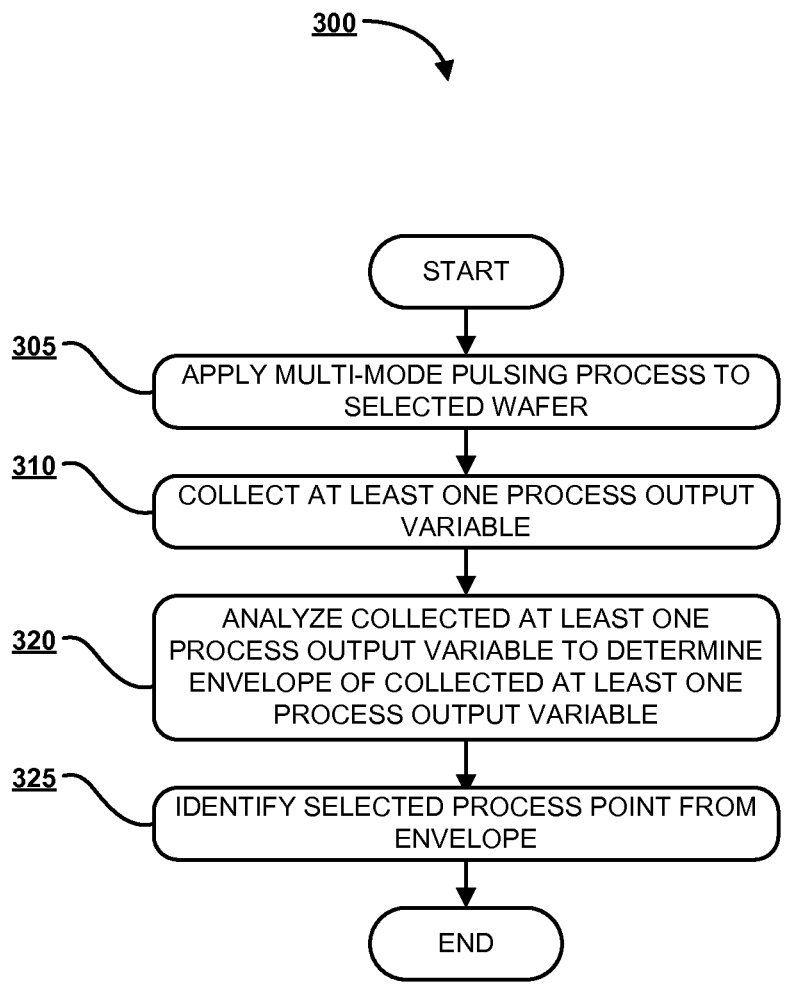
FIG. 3 is a flowchart diagram that illustrates the method operations performed in identifying a selected process point in a multi-mode pulsing process, for implementing embodiments of the present disclosure.

FIG. 3 is a flowchart diagram that illustrates the method operations 300 performed in identifying a selected process point in a multi-mode pulsing process, for implementing embodiments of the present disclosure. In an operation 305, a wafer is placed in the plasma processing chamber 110 and a multi-mode pulsing process is applied to the wafer. As described above, the multi-mode pulsing process can include multiple cycles and each one of the cycles can include one or more phases.

Each of the phases can be different than the previously applied phases. The same phase can be repeated within each cycle and/or can be repeated from one cycle to another cycle. The phases typically reoccur in one or more of the cycles. The order of the phases can be the same or different in each cycle in which the phase occurs. The order of occurrence and repetitions of the phases are determined by the recipe logic 122 in the controller 120.

Each of the different phases can have a duration of between about 2 seconds and about 20 seconds. Due to the relatively short duration of each phase, the typical process point detection approaches are misled and generally not accurate as the typical process point detection approaches require a detection time greater than the length of the phases applied in a multi-mode pulsing process.

Applying the multi-mode pulsing process to the wafer produces multiple process output variables. By way of example, the multi-mode pulsing process can produce process output variables including, but not limited to: an emitted spectrum, a reflected spectrum, an RF harmonic, an RF voltage, an RF current, an RF impedance, a process chamber temperature and/or a process chamber pressure and other process output variables. In an operation 310, at least one process output variable for at least one of the phases is selected for collection during one or more cycles of the multi-mode pulsing process for the wafer. The collected process output variable(s) can vary in each of the different phases.

FIGS. 4A-4E illustrate graphs 410, 450, 460, 470 and 480, respectively, of a selected process output variable collected during multiple cycles of a multi-mode pulsing process, for implementing embodiments of the present disclosure. The selected process output variable is an intensity level of a reflected light at the wavelength of 387 nm. However, it should be understood that the selected process output variable is merely exemplary and other process output variable could alternatively and/or additionally be selected and collected.

Figure 4A:
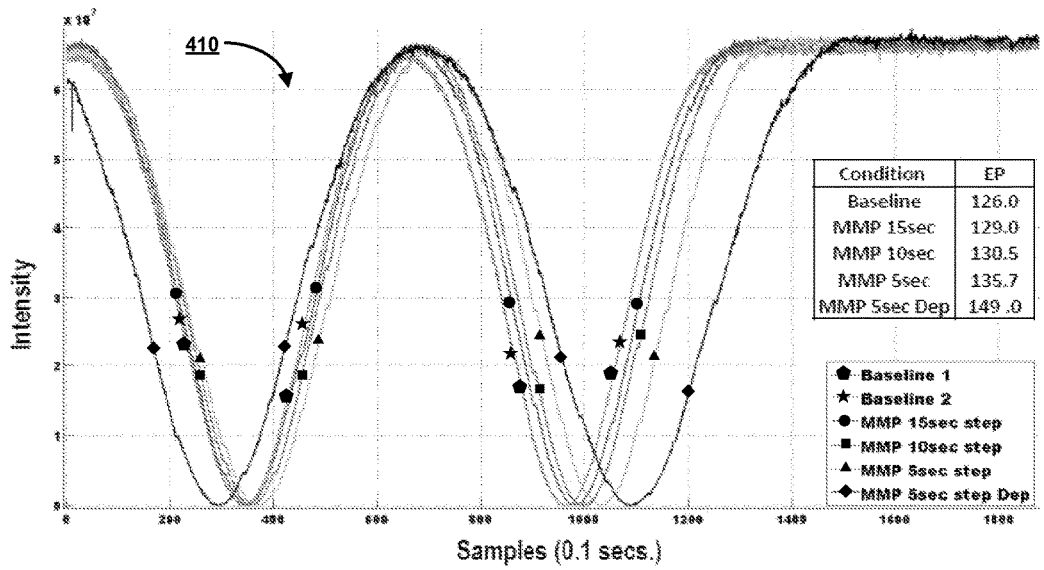
FIGS. 4A-4E illustrate graphs of a selected process output variable collected during multiple cycles of a multi-mode pulsing process, for implementing embodiments of the present disclosure.
Figure 4B:
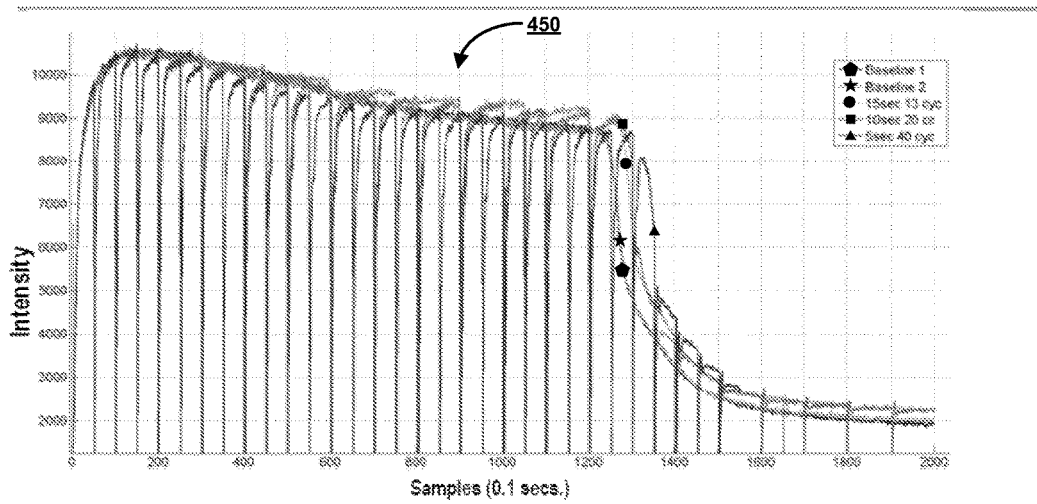
Figure 4C:
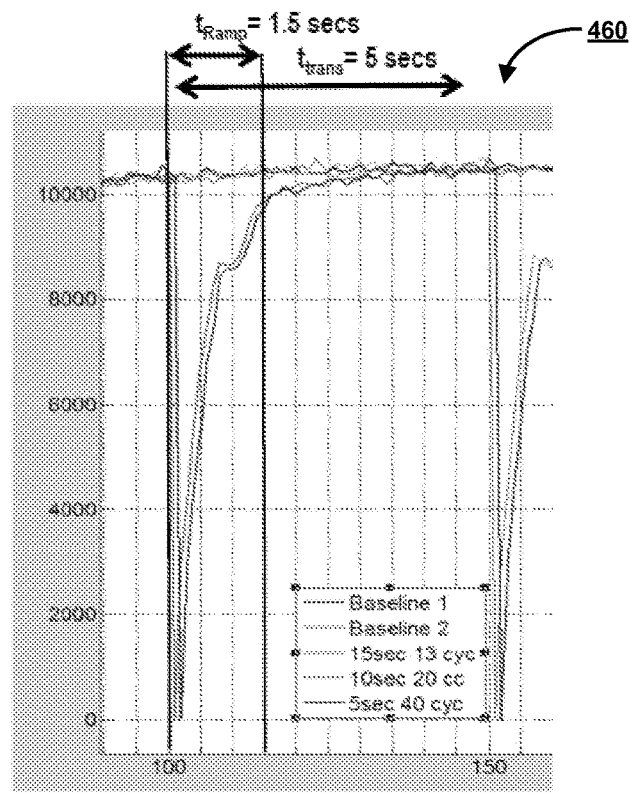

Graph 450 of FIG. 4B illustrates the emitted wavelength of 387 nm across multiple cycles, where each of the substantially vertical lines of the graph 450 represent one phase of the multimode pulsing cycle. Graph 460, of FIG. 4C, illustrates a more detailed view of a portion of the emitted wavelength of 387 nm shown in FIG. 4B. Graph 460 of FIG. 4C illustrates a further detailed view of the detected ramp of the emitted wavelength of 387 nm in a ramp portion, $t_{ramp}$, of a phase having a duration, $t_{trans}$.

The reflected and emitted wavelength of 387 nm is sampled at a sampling rate of 10 Hz (e.g., one sample every 0.1 seconds) in both graph 410 and graph 450, respectively. It should be understood that the sampling rate can be between about 1 Hz and about 10,000 Hz.

Figure 4D:
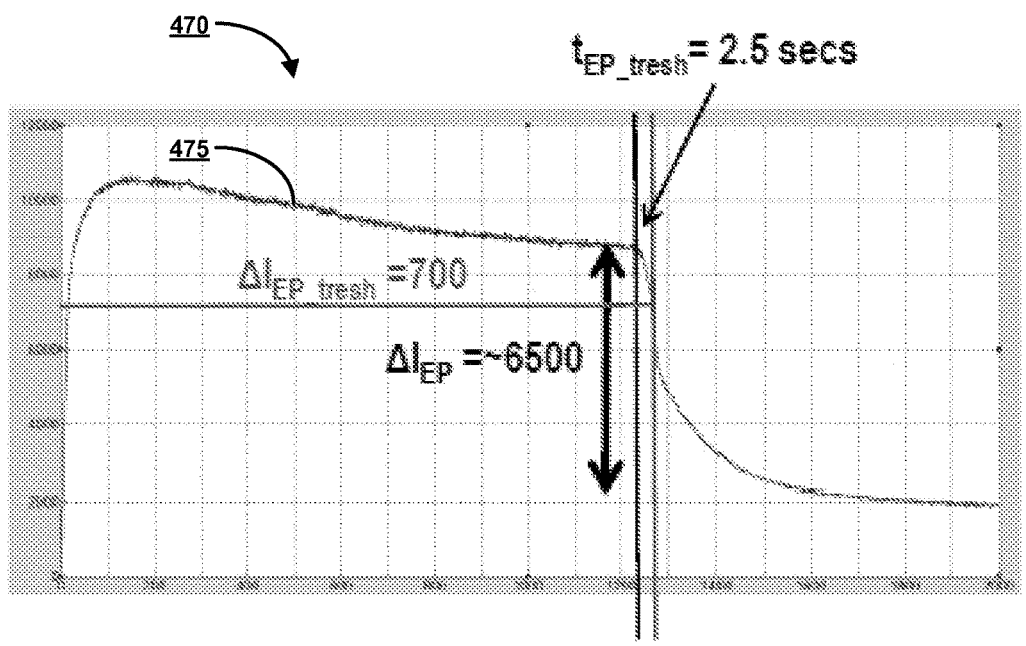

In an operation 320, the collected process output variable, the emitted wavelength of 387 nm, in this instance, is analyzed to determine an envelope of the collected process output variable. FIG. 4D illustrates a graph 470 of the envelope 475 of the graph 450 of FIG. 4B. The envelope 475 can be an outline of the graph 450 of the reflected wavelength of 387 nm, and/or other selected process output variable. The envelope 475 provides a trend of the selected process output variable over a period of several cycles and phases.

In an operation 325, the selected process point can be identified from the selected and analyzed one or more process output variable(s). As shown in graph 470 of FIG. 4D, the envelope 475 has an easily detectable transition as it trends downward in a very short time interval $t_{EP\_tresh}$ and transitions to a preselected threshold level $\Delta l_{EP\_tresh}$. The selected process point can be identified as the combination of the downward trend meeting the preselected threshold level $\Delta I_{EP\_tresh}$.

Figure 4E:
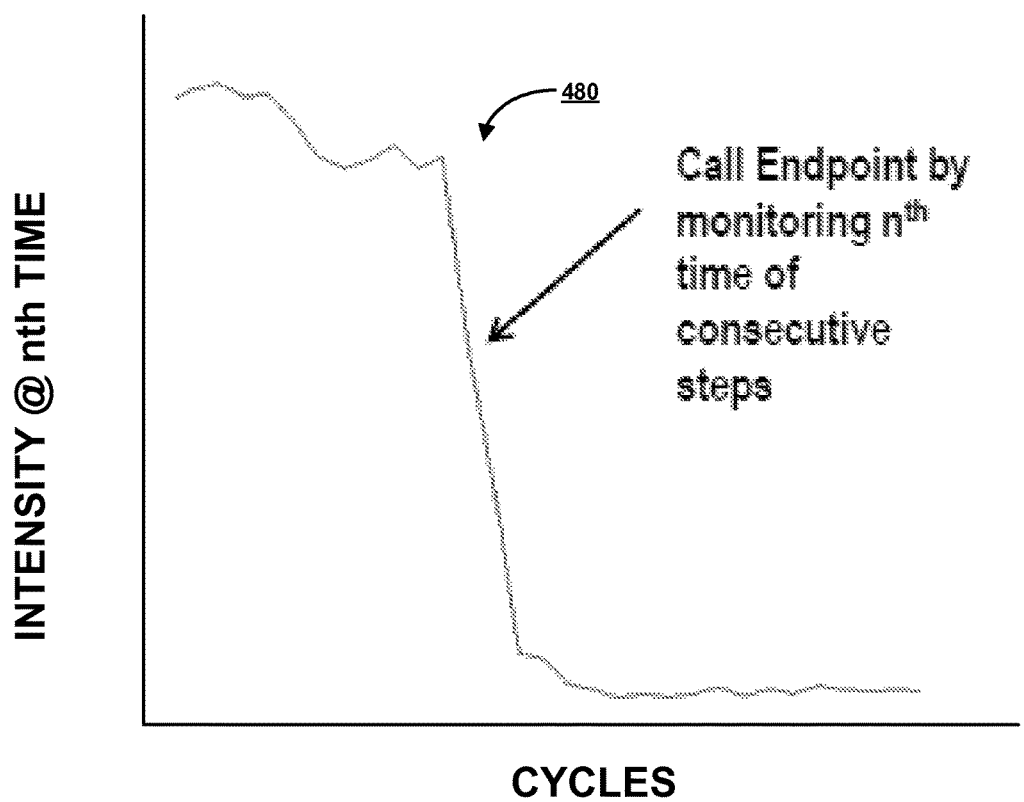

Additionally or alternatively, the process point can be identified by comparing the same time point in a selected phase of every cycle and using a threshold values to detect the process point of interest as shown in graph 480 of FIG. 4E. Repeating this procedure real-time at every point enables timely detection of the process point. This method can be implemented in combination with the previously described downward trend or other shape or trend in the envelope 475 and a preselected offset in time, in phases, or cycles. By way of example, a multi-mode pulsing process endpoint may be identified as occurring at a specific time point in a selected phase of a cycle.

Figure 5:
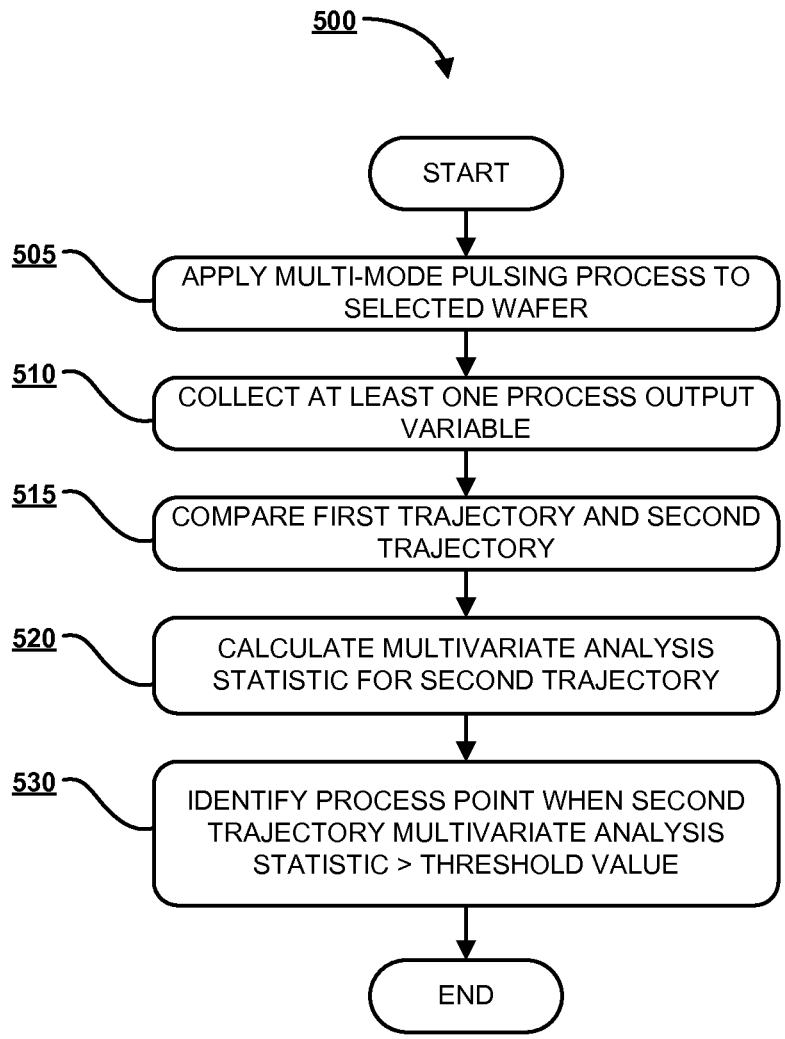
FIG. 5 is a flowchart diagram that illustrates the method operations performed in identifying a selected process point in a multi-mode pulsing process, for implementing embodiments of the present disclosure.

FIG. 5 is a flowchart diagram that illustrates the method operations 500 performed in identifying a selected process point in a multi-mode pulsing process, for implementing embodiments of the present disclosure. In an operation 505, a wafer is placed in the plasma processing chamber 110 and a multi-mode pulsing process is applied to the wafer. As described above, the multi-mode pulsing process can include multiple cycles and each one of the cycles can include one or more phases. In an operation 510, at least one process output variable for at least one of the phases is selected for collection during one or more cycles of the multi-mode pulsing process for the wafer.

In an operation 515, all trajectories until the last trajectory of a phase for all previous cycles are compared. The time point where a deviation of the last trajectory from the previous trajectories of a specific phase of multiple cycles determines the point of interest in the process.

In an operation 520, a multivariate analysis statistic is calculated for the trajectories of the same phase of all previous cycles including the current (last) cycle.

In an operation 530, the selected process point is identified when the multivariate analysis statistic for the current (last) trajectory exceeds a threshold value.

Figure 6A:
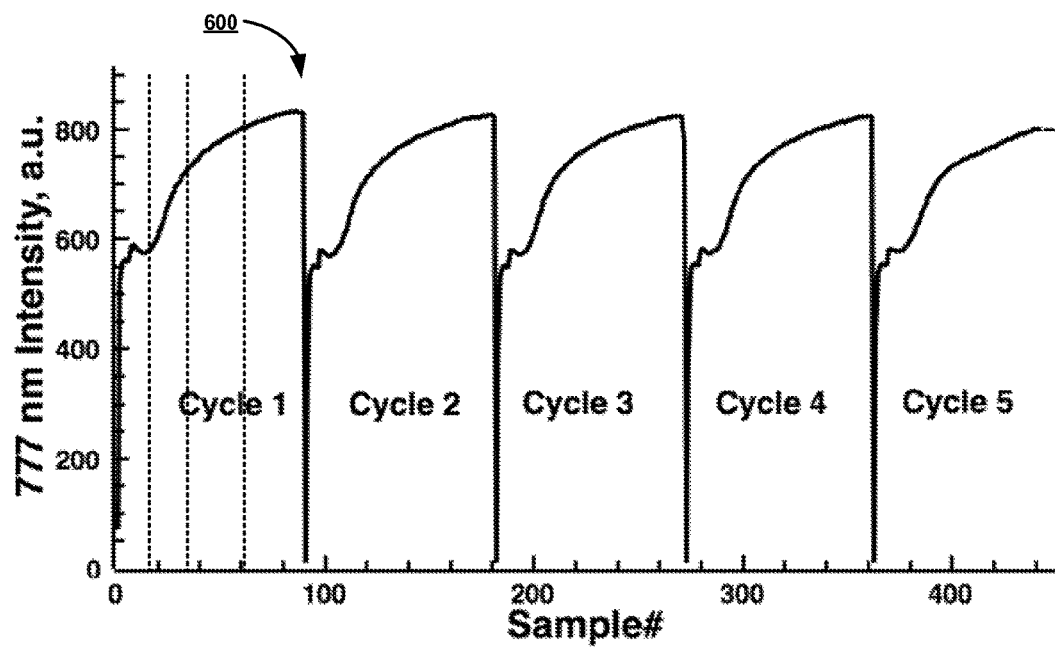
FIGS. 6A and 6B are graphs of a detected light intensity collected over multiple cycles of a multi-mode pulse process, for implementing embodiments of the present disclosure.
Figure 6B:
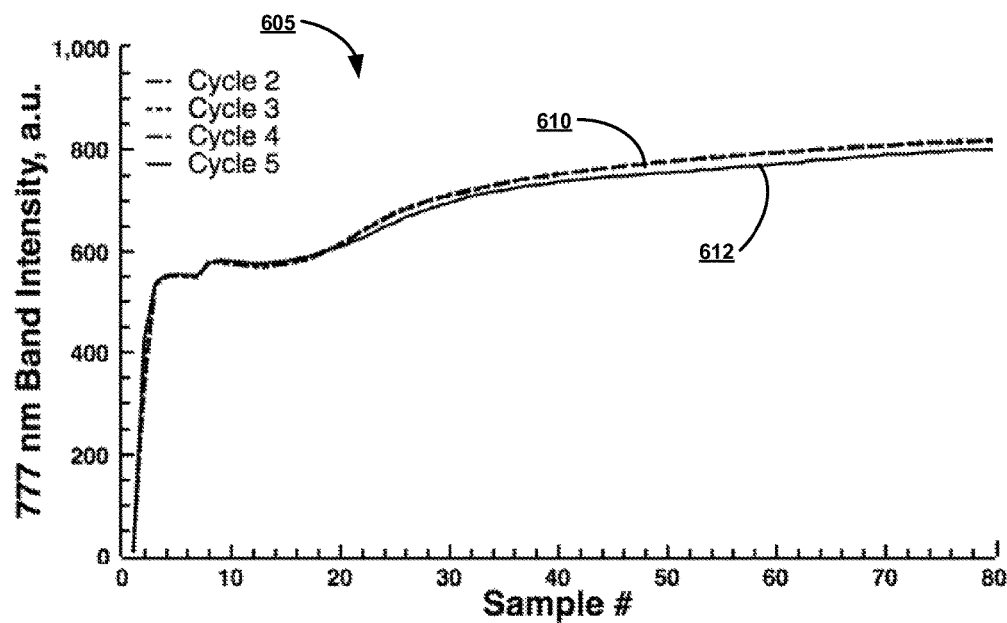

FIGS. 6A and 6B are graphs 600 and 605 of a detected light intensity collected over multiple cycles of a multi-mode pulse process, for implementing embodiments of the present disclosure. A light intensity at a single selected wavelength of 777 nm is shown as detected by one or more of the light sensors 130, 131 during five cycles, e.g., cycles 1-5, of the multi-mode pulse process. Emissions from other phases and at other wavelengths are not shown in graph 600. The detected light is sampled approximately 450 times during the duration of the cycles 1-5. The 450 samples can be evenly spaced in time as shown, but it should be understood that the 450 samples may be unevenly spaced in time. As shown, the intensity of the light at 777 nm is very similar in each of cycles 1-4. In contrast, the intensity of the light at 777 nm during cycle 5 is somewhat dissimilar to the intensities in each of cycles 1-4.

Figure 6C:
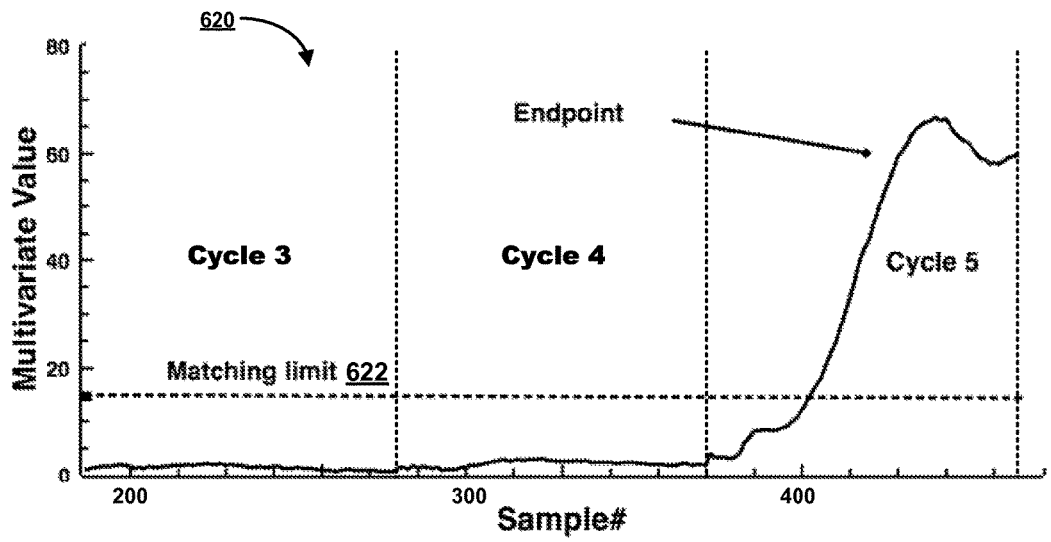
FIG. 6C is a graph of more than one detected variable collected over multiple cycles of a multi-mode pulse process, for implementing embodiments of the present disclosure.

Graph 610 of FIG. 6B illustrates the same data set as shown in graph 600 in FIG. 6A, however graph 610 illustrates all cycles 1-5 shown in an overlay format. Graph 610 illustrates the similarity of cycles 2-4 and the dissimilarity of cycle 5. Graph 610 shows a comparison of the intensities of the selected wavelength for each of cycles 2-4. As the intensities of the selected wavelength for each of cycles 2-4 are very similar, the differences between the intensities are very small and as a result, the substantially single line graph 610 encompasses all of cycles 2-4. In contrast, the intensity of the light at 777 nm during cycle 5 is somewhat dissimilar to the intensities in each of cycles 1-4 and thus is offset as graph 612 from the graph 610 for cycles 2-4. The dissimilarity is the result of reaching the process endpoint condition. Each of these curves represents a trajectory of the multimode pulsing process output variable. Comparing these trajectories over time shows that a difference begins to appear in the fifth cycle at sample 25. One wavelength may not be sufficient or may not provide enough signal to distinguish the change, thus applying a multivariate statistics to the entire spectrum or a region of the spectrum or multiple selected wavelengths in the spectrum may yield a better detection limit. This is illustrated in FIG. 6C where a multivariate statistic is calculated for all the cycles using the entire emitted spectrum from 200-1000 nm. It should be noted that the multivariate statistic is substantially constant across cycles 3 and 4 and begins to show a significant change in cycle 5 indicating that the process reached endpoint condition.

FIG. 6C is a graph 620 of more than one detected variable collected over multiple cycles of a multi-mode pulse process, for implementing embodiments of the present disclosure. The graph 620 is a multivariate statistic calculated using trajectories method. Multiple wavelengths are used in graph 620. Graph 620 can represent as many as all detectable light wavelengths. In FIGS. 6A and 6B, above, a single, selected variable, specifically the intensity at 777 nm wavelength, is detected and recorded in the graphs 600 and 605. In contrast, multiple variables are combined and reported in graph 620 of FIG. 6C. The multiple variables can include intensities of one or more selected wavelengths and/or other process variables including one or more of an RF current, an RF voltage, an RF power, a bias voltage, a plasma process chamber pressure, one or more gas flowrates or any other selected multi-mode pulse process variable.

A threshold matching limit 622 is selected. The threshold matching limit 622 can be selected according to a past experience and/or testing results. The graph 620 exceeds the threshold matching limit 622 during cycle 5 and thus an endpoint can be identified during cycle 5.

Figure 6D:
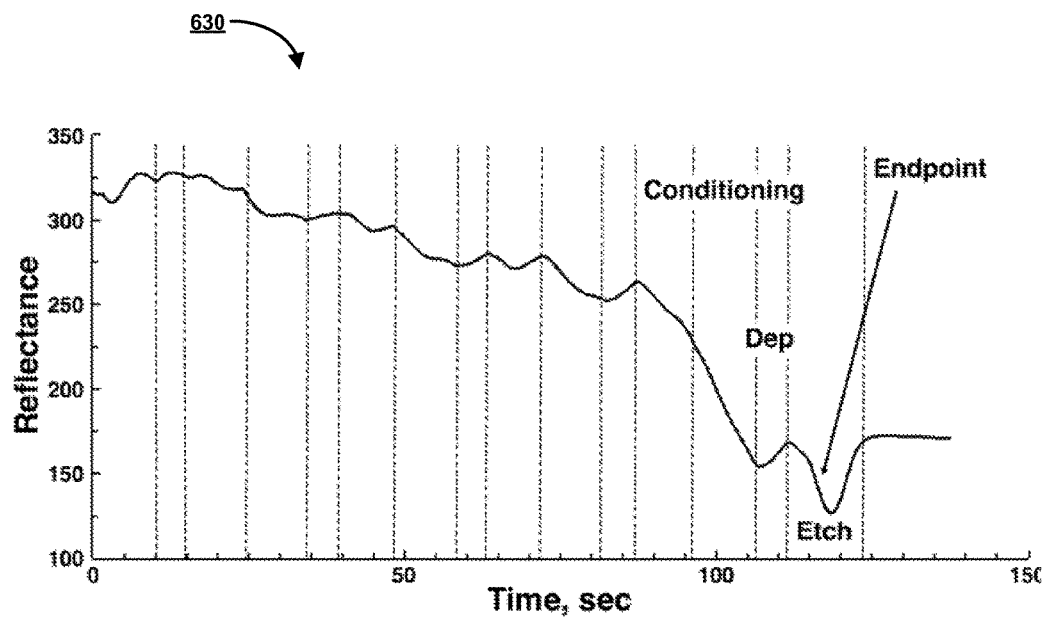
FIG. 6D is a graph of a reflected light intensity collected over multiple cycles of a multi-mode pulse process, for implementing embodiments of the present disclosure.

FIG. 6D is a graph 630 of a reflected light intensity collected over multiple cycles of a multi-mode pulse process, for implementing embodiments of the present disclosure. The graph 630 shows 275 nm light reflected from the surface of the wafer being processed in the multi-mode pulse process. It should be understood that while 275 nm is the selected wavelength for graph 630, any suitable wavelength can be selected. As shown the intensity of the reflected light is relatively high between 0 seconds and about 87 seconds into the multi-mode pulse process. The intensity of the reflected light is relatively constant between time 0 and about 87 seconds because the layer on the surface of the wafer being processed is optically thick. The optically thick surface reflects a substantially equal intensity.

After about 87 seconds, the reflected light intensity begins a generally downward trend to a minimum intensity at about 118 seconds into the multi-mode pulse process. The intensity of the reflected light drops off as the layer on the surface of the wafer being processed becomes optically thin and an underlying layer begins to reflect the light. Each type of material will reflect light at different wavelengths differently. It should be noted that the localized peak at about 112 seconds is a result of a deposition process phase occurring between about 106 seconds and about 112 seconds.

Figure 6E:
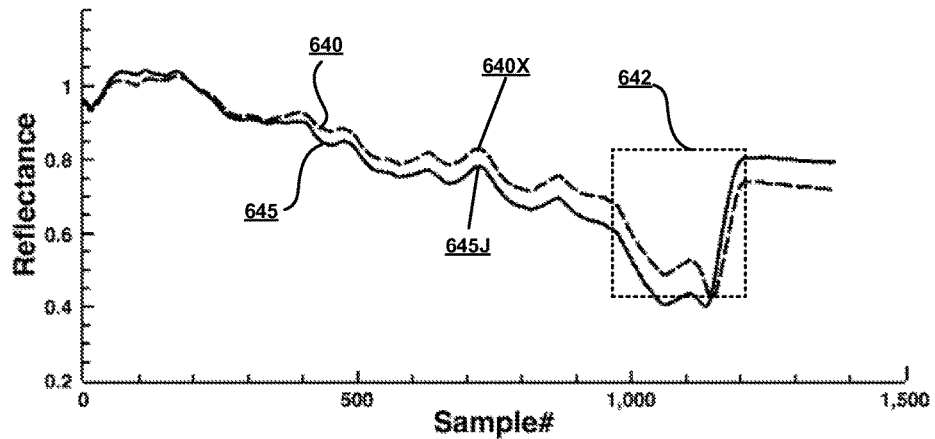
FIG. 6E is a graph of a pattern of one or more selected process variable during multiple cycles of a multi-mode pulse process, for implementing embodiments of the present disclosure.

FIG. 6E is a graph of a pattern 640 of one or more selected process variables during multiple cycles of a multi-mode pulse process, for implementing embodiments of the present disclosure. The pattern 640 can be generated by many different ways such as described above in FIGS. 6A-D. Alternatively, the pattern 640 can be based on an average result of one or more wafers undergoing the multiple cycles of the same multi-mode pulse process.

Graph 645 is the graph of the same one or more variables used to form the pattern 640 as the multiple cycles of the same multi-mode pulse process is applied to a wafer being evaluated. The pattern 640 and the graph 645 are compared and an endpoint can be found to correspond to the endpoint of the pattern 640. The comparison of the pattern 640 and the graph 645 can be difficult to achieve in real time.

Figure 6F:
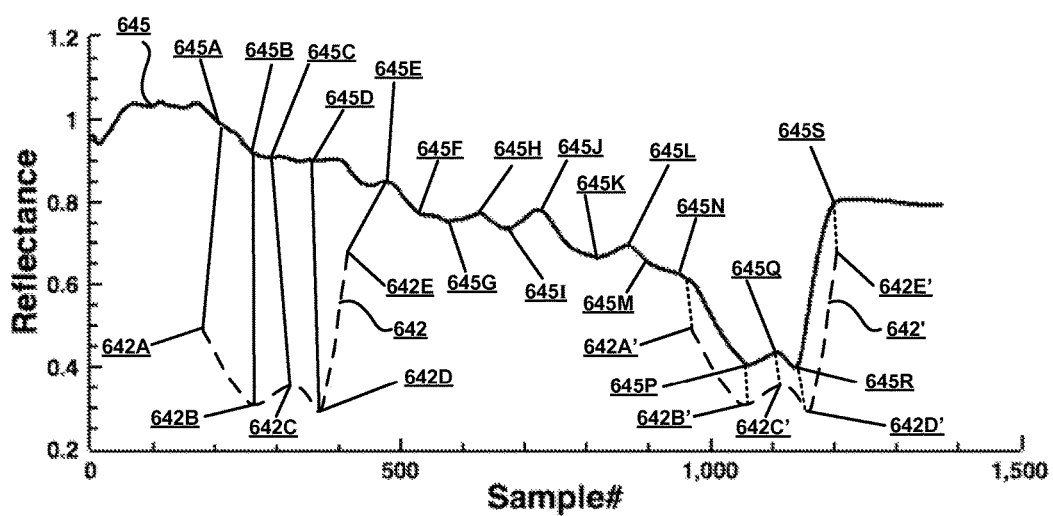
FIG. 6F is a graph of a endpoint portion of the pattern compared to graph of one or more selected process variables during multiple cycles of a multi-mode pulse process, for implementing embodiments of the present disclosure.

FIG. 6F is a graph of a endpoint portion 642 of the pattern 640 compared to graph 645 of one or more selected process variables during multiple cycles of a multi-mode pulse process, for implementing embodiments of the present disclosure. As an alternative, the endpoint portion 642 of the pattern 640 can be used for near real time comparison to the graph 645, as the multiple cycles of the same multi-mode pulse process are applied to the wafer being evaluated. Comparing the endpoint portion 642 of the pattern 640 includes selecting multiple points 642A-E and comparing the selected point to possible corresponding points 645A-E on the graph 645. The difference value between the corresponding points, e.g., 642A compared to 645A, can be expressed as a distance absolute value. Multiple points 642A'-E' can be continually compared to subsequent corresponding points 645N-S until a minimum distance absolute value is achieved where 642A'-E' correspond to points 645N-S and an endpoint 645R can be identified.

Figure 6G:
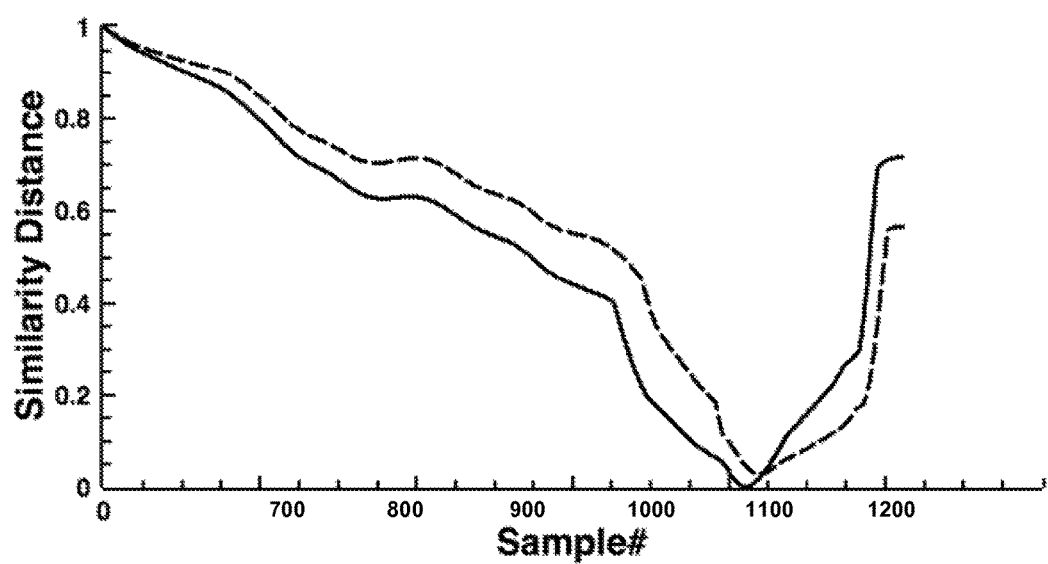
FIG. 6G is a graph of the difference distance between the graph and the endpoint portion of the pattern, for implementing embodiments of the present disclosure.

FIG. 6G is a graph of the difference distance between the graph 645 and the endpoint portion 642 of the pattern 640, for implementing embodiments of the present disclosure. At about sample 1100, the difference is a minimum value and thus is a closest match to the endpoint portion 642 when the endpoint portion 642 is in position 642' as shown in FIG. 6F.

The foregoing pattern matching process was used to identify an example endpoint 645R in the graph 645, however, the foregoing pattern matching process could also be used to find a corresponding process point in any portion of the pattern 640. By way of example, a selected point in the process, e.g., a process point 640X, as shown in FIG. 6E could be used to find a corresponding point 645J in the graph 645, using the foregoing pattern matching process.

Figure 7:
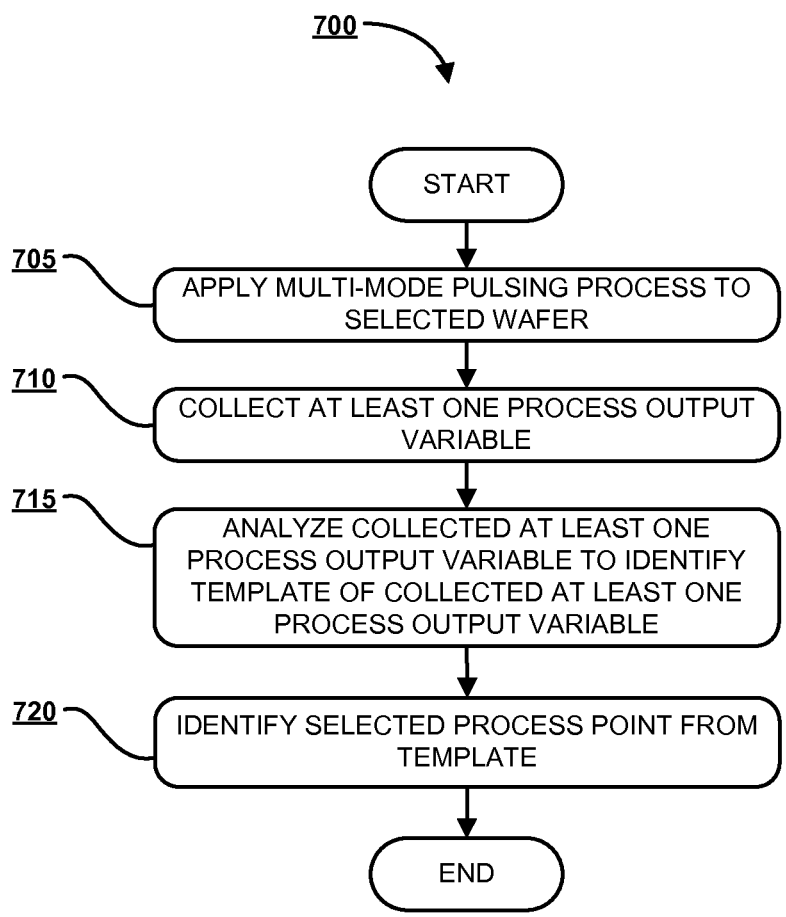
FIG. 7 is a flowchart diagram that illustrates the method operations performed in identifying a selected process point in a multi-mode pulsing process, for implementing embodiments of the present disclosure.

FIG. 7 is a flowchart diagram that illustrates the method operations 700 performed in identifying a selected process point in a multi-mode pulsing process, for implementing embodiments of the present disclosure. In an operation 705, a wafer is placed in the plasma processing chamber 110 and a multi-mode pulsing process is applied to the wafer. As described above, the multi-mode pulsing process can include multiple cycles and each one of the cycles can include one or more phases. In an operation 710, at least one process output variable for at least one of the phases is selected for collection during one or more cycles of the multi-mode pulsing process for the wafer.

In an operation 715, the collected process output variable(s) are analyzed to identify a template for the selected process point of the multi-mode pulsing process. The template that is identified corresponding to the process point should be sufficiently similar for the monitored output variable(s) for all wafers of interest. Identifying the selected multi-mode pulsing process point can be performed by matching the template for the selected process point to the collected at least one process output variable(s) for all selected wafers in an operation 720. In one implementation, the template identified for the process point includes one or more unique characteristics, e.g., curve(s), that are different from other process points so that the pattern can be matched across multiple wafers on process output variable(s) during the multi-mode pulsing process. The wafers selected for identifying the reference templates can be different than the wafers that are being tested. In this instance, the current condition of the plasma process chamber 110 remains a constant and the template being selected does not evolve as more wafers are processed in the plasma process chamber.

More than one template could be identified as the reference template(s) from at least one reference wafer(s) corresponding to the process point. For the test wafers, pattern matching can detect the process point if the pattern on the process output variable of the wafer being tested is matched with at least one template from the reference templates. By way of example, the multiple wafers processed to identify a template of the process output variable(s) may include multiple reference/test wafers to determine a characterization template for the plasma process chamber 110. Alternatively, the characterization template for the plasma process chamber 110 can be identified as a theoretical, desired template rather than determined from actual processing multiple wafers in the plasma process chamber 110.

Alternatively, the multiple wafers processed to identify the template(s) of the process output variable(s) may include the reference wafers and/or a selected number of recently processed test wafers that were processed in the plasma process chamber 110. This alternative allows the template to evolve to include and to reflect the current condition of the plasma process chamber 110.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

Figure 8:
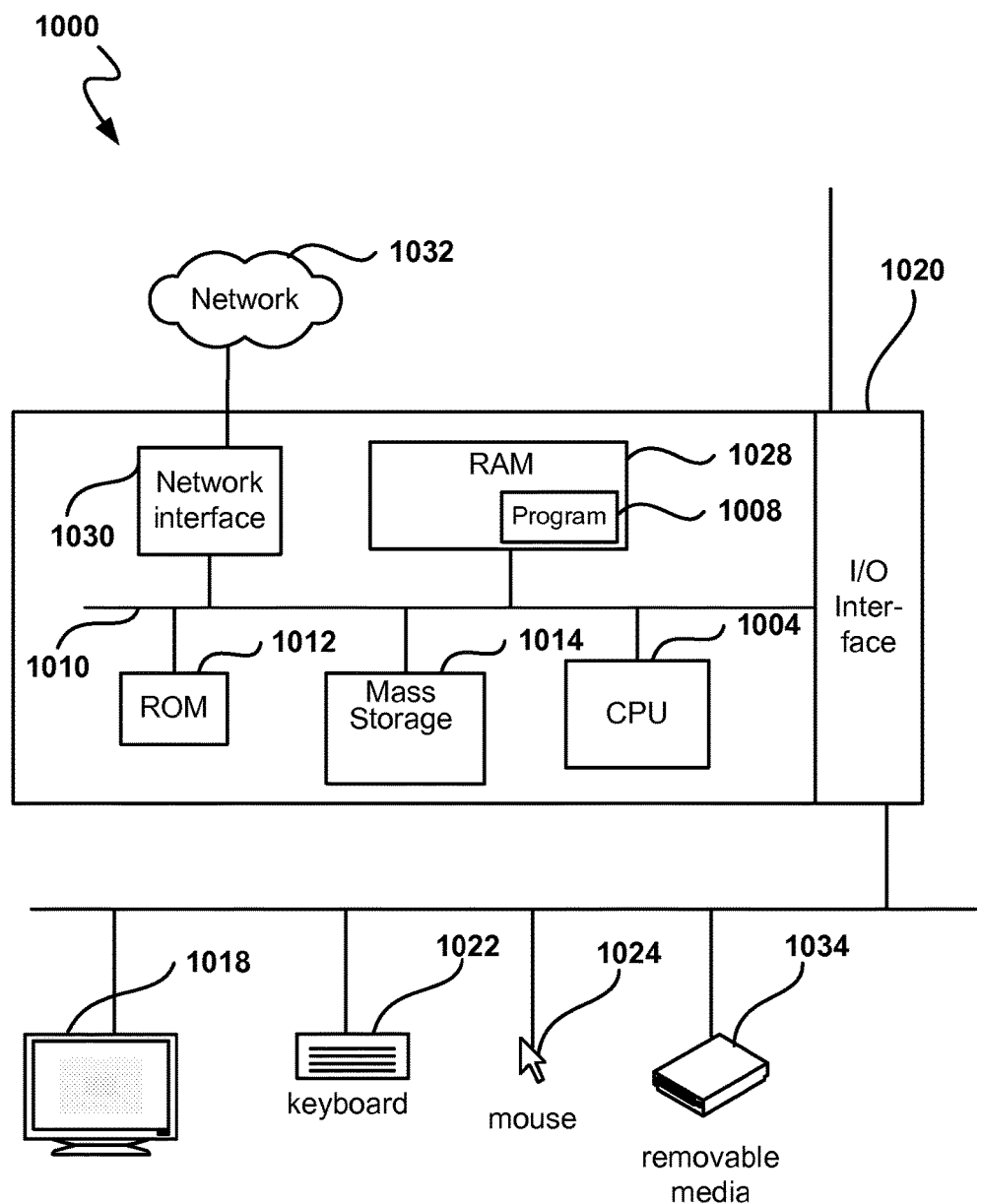
FIG. 8 is a block diagram of an example computer system for carrying out the processing according to the invention.

FIG. 8 is a block diagram of an example computer system 1000 for carrying out the processing according to the invention. A general or specialized computer system, such as the computer system 1000, can be used as a controller 120 for controlling a system executing the operations for performing at least a portion of the processes described above. The computer system 1000 includes a computer 1002, a display 1018, an optional printer or output device (not shown), a removable media (e.g., magnetic/optical/flash) drive 1034, a mass storage system 1014 (e.g., hard disk drive, solid state drive, or other suitable data storage device), a network interface 1030, and a keyboard 1022. Additional user interface devices such as a mouse 1024, a touch pad or touch screen can also be included.

The computer 1002 includes a central processing unit 1004, one or more data buses 1010, random access memory (RAM) 1028, read only memory (ROM) 1012, and an input/output interface 1020. The computer 1002 can be a personal computer (such as an IBM compatible personal computer, a Macintosh computer or Macintosh compatible computer), a workstation computer (such as a Sun Microsystems or Hewlett-Packard workstation), or some other suitable type of computer.

The CPU 1004 can be a general purpose digital processor or a specially designed processor. The CPU 1004 controls the operation of the computer system 1000. Using instructions retrieved from memory (e.g. program(s) 1008), the CPU 1004 controls the reception and manipulation of input data and the output and display of data on output devices.

The data buses 1010 are used by the CPU 1004 to access the RAM 1028, the ROM 1012 and the mass storage 1014. The RAM 1028 is used by the CPU 1004 as a general storage area and as scratch-pad memory, and can also be used to store input data and processed data. The RAM 1028 and the ROM 1012 can be used to store computer readable instructions or program code 1008 readable and executable by the CPU 1004 as well as other data.

The bus 1010 can also be used to access the input, output, and storage devices used by the computer 1002. These devices include the display 1018, the optional printer (not shown), the removable media drive 1034, and the network interface 1030. The input/output interface 1020 is used to receive input from keyboard 1022 and send decoded symbols for each pressed key to CPU 1004 over the data bus 1010.

The display 1018 is an output device that displays images of data provided by the CPU 1004 via the bus 1010 or provided by other components in the computer system 1000. The optional printer device, when operating as a printer, provides an image on a sheet of paper or a similar surface. Other output devices such as a plotter, projector, etc. can be used in place of, or in addition to, the printer device.

The removable media drive 1034 and the mass storage 1014 can be used to store various types of data. The removable media drive 1034 facilitates transporting such data to other computer systems, and mass storage 1014 permits fast access to large amounts of stored data. The mass storage 1014 may be included within the computer system or may be external to the computer system such as network attached storage or cloud storage accessible over one or more networks (e.g., local area networks, wide area networks, wireless networks, Internet 1032) or combinations of such storage devices and locations.

The CPU 1004 together with an operating system operate to execute computer readable code and logic and produce and use data. The computer code, logic and data may reside within the RAM 1028, the ROM 1012, or the mass storage 1014 or other media storage devices and combinations thereof. The computer code and data could also reside on a removable program medium and loaded or installed onto the computer system 1000 when needed. Removable program media include, for example, DVD, CD-ROM, PC-CARD, floppy disk, flash memory, optical media and magnetic disk or tape.

The network interface 1030 is used to send and receive data over a network 1032 connected to other computer systems. An interface card or similar device and appropriate software implemented by the CPU 1004 can be used to connect the computer system 1000 to an existing network and transfer data according to standard protocols such as local area networks, wide area networks, wireless networks, Internet and any other suitable networks and network protocols.

The keyboard 1022 is used by a user to input commands and other instructions to the computer system 1000. Other types of user input devices can also be used in conjunction with the present invention. For example, pointing devices such as a computer mouse, a track ball, a stylus, touch pad, touch screen or a tablet can be used to manipulate a pointer on a screen of a general-purpose computer.

It will be further appreciated that the instructions represented by the operations in the above figures are not required to be performed in the order illustrated, and that all the processing represented by the operations may not be necessary to practice the invention. It should also be appreciated that some operations may have sub-operations and in other instances, certain operations described herein may not be included in the illustrated operations. Further, the processes described in any of the above figures can also be implemented in software stored in any one of or combinations of the RAM, the ROM, or the hard disk drive.

The invention can also be embodied as computer readable code and/or logic on a computer readable medium. The computer readable medium is any data storage device that can store data which can thereafter be read by a computer system. Examples of the computer readable medium include hard drives, network attached storage (NAS), logic circuits, read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A method comprising:
    applying a multi-mode pulsing process to one or more wafers in a plasma process chamber, the multi-mode pulsing process including a plurality of cycles;
    collecting at least one process output variable during the plurality of cycles for the one or more wafers;
    applying the multi-mode pulsing process to a selected wafer in the plasma process chamber;
    collecting at least one process output variable during the plurality of cycles of the multi-mode pulsing process for the selected wafer;
    comparing a first trajectory of the at least one process output variable collected by applying the multi-mode pulsing process to the one or more wafers with a second trajectory of the at least one process output variable collected by applying the multi-mode pulsing process to the selected wafer;

calculating a distance from a point on the first trajectory to a point on the second trajectory; and determining based on the distance whether an endpoint of the multi-mode pulsing process for the selected wafer is reached, wherein the endpoint is reached when the distance is a minimum distance from multiple distances between a plurality of points on the first trajectory and a plurality of points on the second trajectory.

2. The method of claim 1, wherein during the multi-mode pulsing process, the plurality of cycles are repeated for multiple times until the endpoint is reached for the selected wafer, wherein each of the plurality of cycles includes a plurality of phases, wherein during each of the plurality of phases, a different process is applied to the one or more wafers and to the selected wafer.

3. The method of claim 1, wherein the at least one process output variable for the selected wafer includes an emitted spectrum of optical intensity from the plasma process chamber, a reflected spectrum of the optical intensity reflected from a top surface of the selected wafer, a radio frequency (RF) harmonic, an RF voltage at an RF source that supplies an RF signal to the plasma process chamber, an RF current at an output of the RF source, a temperature of the plasma process chamber, a pressure of the plasma process chamber, or a combination thereof.

4. The method of claim 1, wherein each of the first trajectory and the second trajectory identifies the plurality of cycles, wherein each of the plurality of cycles includes a plurality of phases, wherein during each of the plurality of phases, a different process is applied to the one or more wafers and to the selected wafer.

5. The method of claim 1, wherein the point on the first trajectory and the point on the second trajectory are sampled at the same sample count.

6. The method of claim 1, wherein the endpoint is reached after the at least one process output variable for the selected wafer has a value that matches a pre-determined threshold.

7. A controller comprising:
a processor configured to:
apply a multi-mode pulsing process to one or more wafers in a plasma process chamber, the multi-mode pulsing process including a plurality of cycles;
collect at least one process output variable during the plurality of cycles for the one or more wafers;
apply the multi-mode pulsing process to a selected wafer in the plasma process chamber;
collect at least one process output variable during the plurality of cycles of the multi-mode pulsing process for the selected wafer;
compare a first trajectory of the at least one process output variable collected by applying the multi-mode pulsing process to the one or more wafers with a second trajectory of the at least one process output variable collected by applying the multi-mode pulsing process to the selected wafer;
calculate a distance from a point on the first trajectory to a point on the second trajectory; and
determine based on the distance whether an endpoint of the multi-mode pulsing process for the selected wafer is reached, wherein the endpoint is reached when the distance is a minimum distance from multiple distances between a plurality of points on the first trajectory and a plurality of points on the second trajectory; and a memory coupled to the processor, wherein the memory device is configured to store the distance.

8. The controller of claim 7, wherein during the multi-mode pulsing process, the plurality of cycles are repeated for multiple times until the endpoint is reached for the selected wafer, wherein each of the plurality of cycles includes a plurality of phases, wherein during each of the plurality of phases, a different process is applied to the one or more wafers and to the selected wafer.

9. The controller of claim 7, wherein the at least one process output variable for the selected wafer includes an emitted spectrum of optical intensity from the plasma process chamber, a reflected spectrum of the optical intensity reflected from a top surface of the selected wafer, a radio frequency (RF) harmonic, an RF voltage at an RF source that supplies an RF signal to the plasma process chamber, an RF current at an output of the RF source, a temperature of the plasma process chamber, a pressure of the plasma process chamber, or a combination thereof.

10. The controller of claim 7, wherein each of the first trajectory and the second trajectory identifies the plurality of cycles, wherein each of the plurality of cycles includes a plurality of phases, wherein during each of the plurality of phases, a different process is applied to the one or more wafers and to the selected wafer.

11. The controller of claim 7, wherein the point on the first trajectory and the point on the second trajectory are sampled at the same sample count.

12. The controller of claim 7, wherein the endpoint is reached after the at least one process output variable for the selected wafer has a value that matches a pre-determined threshold.

13. A computer-readable medium containing program instructions, wherein execution of the program instructions by one or more processors of a computer system causes the one or more processors to carry out a plurality of operations of:
applying a multi-mode pulsing process to one or more wafers in a plasma process chamber, the multi-mode pulsing process including a plurality of cycles;
collecting at least one process output variable during the plurality of cycles for the one or more wafers;
applying the multi-mode pulsing process to a selected wafer in the plasma process chamber;
collecting at least one process output variable during the plurality of cycles of the multi-mode pulsing process for the selected wafer;
comparing a first trajectory of the at least one process output variable collected by applying the multi-mode pulsing process to the one or more wafers with a second trajectory of the at least one process output variable collected by applying the multi-mode pulsing process to the selected wafer;
calculating a distance from a point on the first trajectory to a point on the second trajectory; and
determining based on the distance whether an endpoint of the multi-mode pulsing process for the selected wafer is reached, wherein the endpoint is reached when the distance is a minimum distance from multiple distances between a plurality of points on the first trajectory and a plurality of points on the second trajectory.

14. The computer-readable medium of claim 13, wherein during the multi-mode pulsing process, the plurality of cycles are repeated for multiple times until the endpoint is reached for the selected wafer, wherein each of the plurality of cycles includes a plurality of phases, wherein during each of the plurality of phases, a different process is applied to the one or more wafers and to the selected wafer.

15. The computer-readable medium of claim 13, wherein the at least one process output variable for the selected wafer includes an emitted spectrum of optical intensity from the plasma process chamber, a reflected spectrum of the optical intensity reflected from a top surface of the selected wafer, a radio frequency (RF) harmonic, an RF voltage at an RF source that supplies an RF signal to the plasma process chamber, an RF current at an output of the RF source, a temperature of the plasma process chamber, a pressure of the plasma process chamber, or a combination thereof.

16. The computer-readable medium of claim 13, wherein each of the first trajectory and the second trajectory has the plurality of cycles, wherein each of the plurality of cycles includes a plurality of phases, wherein during each of the plurality of phases, a different process is applied to the one or more wafers and to the selected wafer.

17. The computer-readable medium of claim 13, wherein the point on the first trajectory and the point on the second trajectory are sampled at the same sample count.

18. The computer-readable medium of claim 13, wherein the endpoint is reached after the at least one process output variable for the selected wafer has a value that matches a pre-determined threshold.

\* \* \* \* \*